(12) United States Patent
Murai et al.

(10) Patent No.: US 7,294,393 B2
(45) Date of Patent: Nov. 13, 2007

(54) SHEET MATERIAL AND WIRING BOARD

(75) Inventors: Hideya Murai, Tokyo (JP); Tadanori Shimoto, Tokyo (JP); Kazuhiro Baba, Tokyo (JP); Katsumi Kikuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/167,623

(22) Filed: Jun. 27, 2005

(65) Prior Publication Data
US 2005/0281995 A1 Dec. 22, 2005

Related U.S. Application Data

(63) Continuation of application No. PCT/JP2003/014732, filed on Nov. 19, 2003.

(30) Foreign Application Priority Data
Dec. 27, 2002 (JP) ............... 2002-380631

(51) Int. Cl.
B32B 3/06 (2006.01)
(52) U.S. Cl. ............... 428/306.6; 428/304.4; 428/308.4; 428/209; 174/258
(58) Field of Classification Search ............ 428/209, 428/304.4, 306.6, 308.4; 174/250, 258
See application file for complete search history.

(56) References Cited

U.S. PATENT DOCUMENTS 3,932,689 A * 1/1976 Watanabe et al. ............ 428/418
4,440,643 A * 4/1984 Makino et al. ........ 210/500.28
4,543,295 A * 9/1985 St. Clair et al. ............ 428/458
5,374,469 A * 12/1994 Hino et al. .................. 428/209
5,538,789 A * 7/1996 Capote et al. .............. 428/344
5,719,354 A * 2/1998 Jester et al. ................. 174/255
5,741,598 A * 4/1998 Shiotani et al. ............. 428/458
5,744,758 A * 4/1998 Takenouchi et al. ........ 174/255
5,830,563 A * 11/1998 Shimoto et al. ............ 428/209
6,379,784 B1 * 4/2002 Yamamoto et al. ......... 428/216

(Continued)

FOREIGN PATENT DOCUMENTS

EP 0 556 791 8/1993

(Continued)

OTHER PUBLICATIONS

International Search Report for Corresponding International Application PCT/JP03/14732 dated Mar. 9, 2004.

Primary Examiner—Cathy F. Lam
(74) Attorney, Agent, or Firm—Katten Muchin Rosenman LLP

(57) ABSTRACT

In a sheet material (1), a bonding layer (2) is provided, and then a high-strength layer (3) is laminated on the bonding layer (2). The bonding layer (2) is made of an epoxy resin being a thermosetting material. The high-strength layer (3) is made of polyimide, which is not softened at a thermosetting temperature of the epoxy resin and has a tensile rupture strength higher than that of the cured thermosetting material. Moreover, the polyimide has a tensile rupture strength of 100 MPa or higher at 23° C. and a tensile rupture elongation of 10% or higher at 23° C. Assuming that a tensile rupture strength at −65° C. is a and a tensile rupture strength at 150° C. is b, a ratio (a/b) is 2.5 or less.

23 Claims, 5 Drawing Sheets

U.S. PATENT DOCUMENTS 6,440,542 B1 * 8/2002 Kariya .................. 428/209

FOREIGN PATENT DOCUMENTS

| | | |
|---|---|---|
| EP | 1 091 406 | 4/2001 |
| JP | 62-270636 | 11/1987 |
| JP | 62-279936 | 12/1987 |
| JP | 7-125134 | 5/1995 |
| JP | 08-132574 | 5/1996 |
| JP | 10-044350 | 2/1998 |
| JP | 11-008449 | 1/1999 |
| JP | 2000-198969 | 7/2000 |
| JP | 2001-177010 | 6/2001 |
| JP | 2001-310344 | 11/2001 |
| JP | 2002-83893 | 3/2002 |
| JP | 2002-124751 | 4/2002 |
| JP | 2002-180157 | 6/2002 |
| JP | 2002-198462 | 7/2002 |

* cited by examiner

US 7,294,393 B2

SHEET MATERIAL AND WIRING BOARD

CROSS-REFERENCE TO RELATED APPLICATION

This application is a continuation of International Application PCT/JP2003/014732 filed on Nov. 19, 2003, pending at the time of filing of this continuation application and claims priority from Japanese Patent Application 2002-380631 filed on Dec. 27, 2002, the contents of which are herein wholly incorporated by reference.

TECHNICAL FIELD

The present invention relates to a sheet material formed by laminating two types of layers having different characteristics and a wiring board using the sheet material, and in particular, to a sheet material and a wiring board with high crack resistance and excellent reliability, which can be used for a wiring board of a semiconductor package such as a buildup wiring board.

BACKGROUND ART

With the size reduction and the functionality multiplication of portable equipment and the sophistication of the Internet communication systems in the recent years, semiconductor elements used for them have an increasing number of terminals and a reduced pitch between terminals. With this tendency, a higher density and a finer wiring are required more than ever before, for a wiring board of a semiconductor package equipped with a semiconductor element.

As a wiring board including fine wirings at a high density, there exists a buildup printed wiring board including a buildup wiring layer, in which wirings are formed at a high density on an outer layer of a base core substrate.

FIG. 6 is a sectional view showing a conventional buildup printed wiring board. As shown in FIG. 6, a conventional buildup printed wiring board includes a base core substrate 73 made of glass epoxy. A through hole 71 is formed in the base core substrate 73 with a drill. A diameter of the through hole 71 is, for example, about 300 μm. Conductor wirings 72 are formed on both sides of the base core substrate 73. Interlayer insulating films 75 are formed so as to cover the conductor wirings 72, respectively. A via hole 74 for connection to the conductor wiring 72 is formed in each of the interlayer insulating films 75. A conductor wiring 76 for connection to the conductor wiring 72 through the via hole 74 is provided on the surface of the interlayer insulating film 75. A wiring board may sometimes be formed as a multi-layered wiring board by repeatedly providing an interlayer insulating film including a via hole formed therein and conductor wirings on the conductor wiring 76 as needed.

As a wiring board with further improved operation speed, a thin wiring board at a high density without a core substrate has been proposed. This wiring board is obtained by first forming a wiring layer composed of wirings and an insulating film on a support member such as a metal plate. Thereafter, the support member is removed so that the wiring layer itself serves as a wiring board (for example, see Japanese Patent Laid-Open Publications Nos. 2001-177010, 2002-83893, and 2002-198462). The wiring board is obtained by removing a core substrate from a normal buildup printed wiring board so as to leave a buildup layer alone. Therefore, this wiring board is considered as a ultimate thin wiring board.

Since no through hole is provided in the above-described wiring board, it is not necessary to provide a land serving to connect a wiring to a through hole. Therefore, the control of an impedance is easy while a loop inductance is small. The entire wiring board has high operation speed. Accordingly, the use of the wiring board permits the design of a wiring operating at high speed. Moreover, since a metal plate having excellent evenness, a high elastic modulus, and excellent heat resistance is used as a support member, a fine wiring pattern at a high density with high form stability can be formed by using a high-temperature process.

The wiring board is mainly composed of metal wirings for electric connection and an insulating film for insulating the metal wirings from each other. As an insulating material used for an insulating film in a wiring board including fine wirings at a high density such as a buildup substrates the following materials are conventionally used.

An insulating material made of a thermosetting resin such as an epoxy resin is used for an insulating film of a wiring board fabricated by a semi-additive method or an additive method, that is, a wiring board including a metal wiring formed by electroless plating and/or electrolytic plating. The insulating material is laminated on a substrate in a semi-cured state. After the deposition, the insulating material is heated and cured to be an insulating film. Thereafter, after the formation of a via with a drill or a laser, a treatment such as desmearing is conducted. Then, a metal wiring is formed by electroless plating and/or electroplating.

An insulating material made of a thermosetting resin such as an epoxy resin is also used for an insulating film of a wiring board fabricated by a subtractive method, that is, a wiring board including a metal wiring formed by etching a copper foil. In the subtractive method, an insulating material is applied onto a copper foil to fabricate RCC (Resin Coated Copper foil) in a semi-cured state. The RCC is laminated on a substrate in a semi-cured state. After thermosetting, a via is formed. Thereafter, the copper foil layer is partially etched away, thereby forming a wiring pattern.

Furthermore, as an insulating material, the use of a material containing an inorganic filler in a thermosetting resin such as an epoxy resin and a glass-epoxy composite material obtained by impregnating a medium such as a glass cloth into a resin material such as an epoxy resin is also being examined.

Furthermore, a laminate composed of a plurality of layers is also disclosed as an insulating film of a wiring board. For example, a technique for providing a conductor layer at least on one surface of a polyimide film and providing a bonding layer made of an epoxy resin on the other surface has been disclosed (for example, see Japanese Patent Laid-Open Publication No. 2002-124751) Specifically, in this technique, a laminate composed of a polyimide layer and an epoxy layer is used as an insulating film.

However, the above-described conventional techniques have the following problems. A semiconductor package is normally formed by mounting a semiconductor element made of a semiconductor material such as silicon on a wiring board. The semiconductor element emits heat to have an elevated temperature in operation. When the operation is stopped, the semiconductor element stops emitting heat to have a lowered temperature. When an organic material is used as an insulating material of a wiring board, a thermal expansion coefficient of the organic material is generally several tens of ppm/° C., which is considerably larger than that of silicon (Si) (approximately 4 ppm/° C.). Therefore, with the operation of the semiconductor element, a thermal stress due to a difference in thermal expansion coefficient is generated between the semiconductor element and the wiring board. If the semiconductor element is repeatedly operated and stopped, a thermal stress is also repeatedly applied to the wiring board. As a result, a crack is generated in the insulating layer of the wiring board by the thermal stress. Moreover, if the semiconductor package is used as a vehicle-mounted component or the like, a change in temperature in the environment of use is added to a change in temperature caused with the operation of the semiconductor element because the change in temperature in the environment of use is large. As a result, since the thermal stress is further increased, a crack is more likely to be generated.

In particular, since a thermosetting resin has a small rupture elongation, that is, several % or less, a crack due to a thermal stress is likely to be generated in an insulating film made of a thermosetting resin. Among the thermosetting resins, a generated crack is more likely to expand to cut a metal wiring in an insulating film made of an epoxy resin. As a result, the wiring is broken to put the semiconductor package in an open state. Moreover, the thermal stress causes another problem that a junction interface between a land for connection to BGA and FC and a solder ball is broken. As a result, the metal wiring breakage, the land breakage and the like as described above cause a further problem that the semiconductor element on the wiring board does not normally function.

Moreover, if the insulating film is formed of an epoxy resin alone, it is difficult to treat the epoxy layer by itself because the epoxy resin is fragile with small expansion. Therefore, a film made of an epoxy resin is formed on PET (polyethylene terephthalate) serving as a support member. For use as an insulating film, the support member is peeled off from the epoxy resin film. Therefore, there arises a problem that the formation of a wiring board requires a step of peeling off the support member from the epoxy resin film.

Furthermore, for an insulating material obtained by an inorganic filler contained in a thermosetting resin, a thermal expansion coefficient: can be lowered by adding an inorganic filler in a thermosetting resin such as an epoxy resin to be closer to a thermal expansion coefficient of a semiconductor element so as to reduce a thermal stress because the inorganic material generally has a small thermal expansion coefficient. However, since the rupture elongation and the rupture strength of the entire insulating material are lowered by containing the inorganic filler, sufficient crack resistance cannot be still obtained.

Furthermore, in an insulating material obtained by impregnating the glass cloth material into an epoxy resin, a stress is absorbed by a glass cloth having high strength. However, a part of the insulating material, which does not include any glass fibers, is inevitably generated in terms of a structure of a woven cloth. A crack is generated and a wiring is broken in this part. Moreover, a method of using light (photovia) and a method of using a laser are generally used as a method of forming a via in a wiring board. However, if a wiring board contains glass fibers, the formation of a via with light is not possible. Moreover, for the formation of a via with a laser, the processability with a laser is poor because the melting point of glass is considerably higher than that of an organic material. Therefore, the obtained via is large with a diameter of 100 μm or more. Thus, it is difficult to use the insulating material for a high-density substrate requiring a fine wiring and a fine via. Moreover, since a glass cloth material serving as an inorganic material provide low adhesion with an epoxy resin serving as an organic material, migration is likely to occur through the interface between the glass cloth material and the epoxy resin. Furthermore, since the glass cloth material has a larger specific gravity than the epoxy resin, the glass cloth material is not suitable for a wiring board of equipment that is required to be reduced in weight such as portable equipment.

Furthermore, if the laminate obtained by laminating a bonding layer made of an epoxy resin or the like on a polyimide film disclosed in Japanese Patent Laid-Open Publication No. 2002-124751 is used, the effects of preventing the generation of a crack during the fabrication of a wiring board or at the early stage of a test can be obtained to a certain degree by reducing a linear expansion coefficient of the polyimide film. However, since the tensile rupture strength at a predetermined temperature or the like is not appropriately controlled, the mechanical characteristics of a wiring board gradually degrade to generate a crack if a thermal stress is repeatedly applied to the wiring board. Therefore, the wiring board does not offer long-term reliability.

The enlargement of size, the increase in number of pins and the reduction of a pitch with the higher operation speed and the higher integration of a semiconductor element are expected to rapidly proceed from now on. Thus, the wiring board, on which a semiconductor element is mounted, is required to have a higher density and a finer wiring. Therefore, it is believed that the problem of a crack generated in the insulating film becomes more noticeable from now on. In particular, metal wiring breakage due to a crack generated with a thermal stress becomes a particularly serious problem in a multilayered wiring board without a core substrate disclosed in the above-described Japanese Patent Laid-Open Publications Nos. 2001-177010, 2002-83893, and 2002-198462 because the multilayered wiring board does not include a core substrate for absorbing a generated stress.

The present invention is devised in view of the above problems, and has an object of providing a sheet material suitable as an insulating film of a wiring board such as a buildup wiring board used in a semiconductor package and a wiring board using the sheet material, which have excellent reliability with excellent crack resistance and high adhesion with a substrate or an underlying sheet material.

DISCLOSURE OF THE INVENTION

A sheet material used as an insulating film of a wiring board according to the present invention includes: a first layer made of a first insulating material; and a second layer laminated on the first layer, the second layer being made of a second insulating material having a tensile rupture strength (a tensile breaking strength) of 100 MPa or more at 23° C. and a tensile rupture elongation (a breaking elongation or a total elongation which is an elongation after fracture) of 10% or more at 23° C. and providing a ratio (a/b) of 2.5 or less, assuming that a tensile rupture strength of the second layer at −65° C. is a (MPa) and a tensile rupture strength at 150° C. is b (MPa).

In the present invention, the second layer is made of the second insulating material having a tensile rupture strength of 100 MPa or more at 23° C. and a tensile rupture elongation of 10% or more at 23° C. As a result, even it a crack is generated in the first layer by a thermal stress, the development of the crack can be blocked by the second layer. Therefore, the entire sheet material is never broken by the crack, providing excellent crack resistance. Moreover, by setting the value of the ratio (a/b) at 2.5 or less, a variation in mechanical characteristic between at a high temperature and a low temperature is reduced. Therefore, even if a thermal stress is repeatedly applied for a long period of time, the crack resistance can be prevented from being lowered. Therefore, the sheet material according to the present invention offers excellent reliability. Furthermore, since it is not necessary to use a composite material such as a glass-epoxy composite material in the present invention, good processability of a via can be provided to form a fine via. Moreover, since migration hardly occurs, a specific gravity does not increase. Furthermore, if the first insulating material is appropriately selected in accordance with a substrate or an underlying sheet material, on which the sheet material is laminated, the adhesion with the substrate or the underlying sheet material can be ensured.

Moreover, the second insulating material may be polyimide. In this case, the second insulating material may be porous polyimide. By using porous polyimide as polyimide, the dielectric constant and the dielectric loss of the second insulating material are lowered. As a result, a sheet material, which can be used even in a high frequency band, can be obtained.

Furthermore, it is more preferable that polyimide contain a benzophenone skeleton. As a result, since the benzophenone group contains a carbonyl group being a polar group, the bonding ability with the wiring made or a metal such as copper can be greatly improved when the wiring board is fabricated by using the sheet material.

Alternatively, the second insulating material may be a liquid crystal polymer or a fluorine-containing polymer. In addition, these material may be porous.

Furthermore, it is preferable that the first insulating material be a thermosetting material which is cured at a temperature within a predetermined curing temperature range and the second insulating material be a heat resistant material which is not softened at a temperature within the predetermined curing temperature range. By forming the first layer of the thermosetting material, the first layer serves as a bonding layer with a substrate or another sheet material when the sheet material according to the present invention is laminated on the substrate or another sheet material, thereby realizing good adhesion. Moreover, since the thermosetting material is soft before being thermally cured, the wiring provided on the substrate or another sheet material can be buried in the first layer when the first layer is laminated. Thereafter, the first layer is heated to be cured to fix the shape of the first layer while burying the wiring therein. Furthermore, when the shape of the first layer is fixed, the wiring is formed thereon and then the wiring is solder joined, the first layer is not softened by heat with the solder joint. Specifically, the first layer has excellent soldering resistance.

Furthermore, it is preferable that the first insulating material have an elastic modulus of 2.0 GPa or higher at 150° C. As a result, the stiffness of the first insulating material is ensured when a solder ball, a wire bonding or the like is connected to the wiring board formed by using the sheet material of the present invention. As a result, the connection with the solder ball, the wire bonding or the like can be ensured.

Furthermore, it is preferable that the first insulating material contain an aramid fiber or a fluorine-containing polymer. As a result, the crack resistance can be further improved.

Furthermore, a plurality of concave portions having a depth of 0.1 to 10 μm are formed on the surface of the second layer, which is in contact with the first layer. It is preferable that an opening area of each of the concave portions be smaller than an inner sectional area parallel to the surface of the second layer. As a result, the first insulating material penetrates into the concave portions to be hardened to be convex portions. Each of the convex portions serves as an anchor between the first layer and the second layer, thereby improving the adhesion between the first layer and the second layer.

In this case, it is preferable that the concave portions on the second layer be formed in the following manner. After the second insulating material is formed on a copper foil on which the convex portions are formed, the copper foil is removed. As a result, the convex portions are transferred onto the surface of the second layer. By this method, the second layer, on which the concave portions are formed, can be easily obtained.

It is preferable that a ten-point height of irregularities Rz of the surface of the second layer, on which the concave potions are formed, be 0.1 to 10 μm, more preferably, 1 to 5 μm. The "ten-point height of irregularities" is defined in JIS B0601.

Furthermore, the sheet material according to the present invention may include a third layer made of a metal or an alloy so as to sandwich the second layer with the first layer. As a result, the third layer is selectively etched away, so that the wiring can be easily formed.

The wiring board according to the present invention includes a substrate and the sheet material provided on the substrate. The substrate may be a printed board or a metal substrate made of a metal or an alloy. As a result, a buildup wiring board can be formed.

Another wiring board according to the present invention includes the sheet material, and is formed by first forming the sheet material on a metal plate and then removing the metal plate. As a result, a thin wiring board without including a core substrate can be obtained.

As described above, according to the present invention, the lamination of the first layer and the second layer made of a high-strength material provides a sheet material for a wiring board, which is excellent in crack resistance as well as in reliability. The sheet material and the wiring board can be suitably used for a wiring board of a semiconductor package, for example, a buildup wiring board or the like.

BEST MODE FOR CARRYING OUT THE INVENTION

Figure 1:
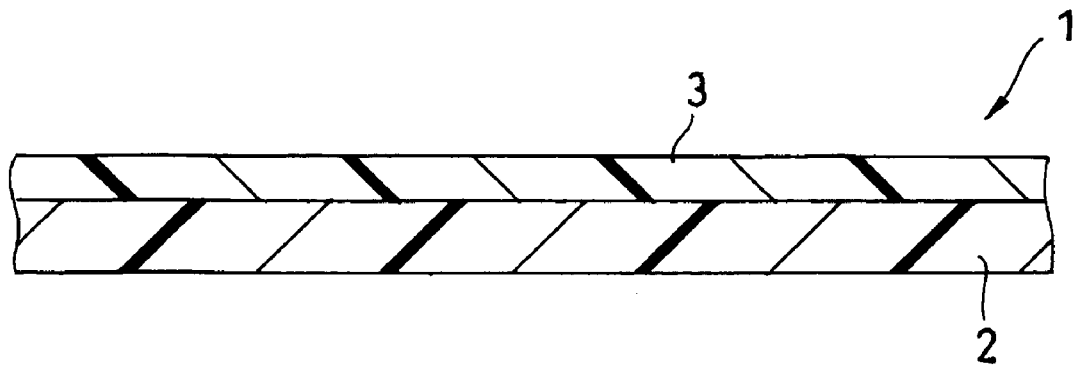
FIG. 1 is a sectional view showing a sheet material according to the first embodiments of the present invention.
Figure 2:
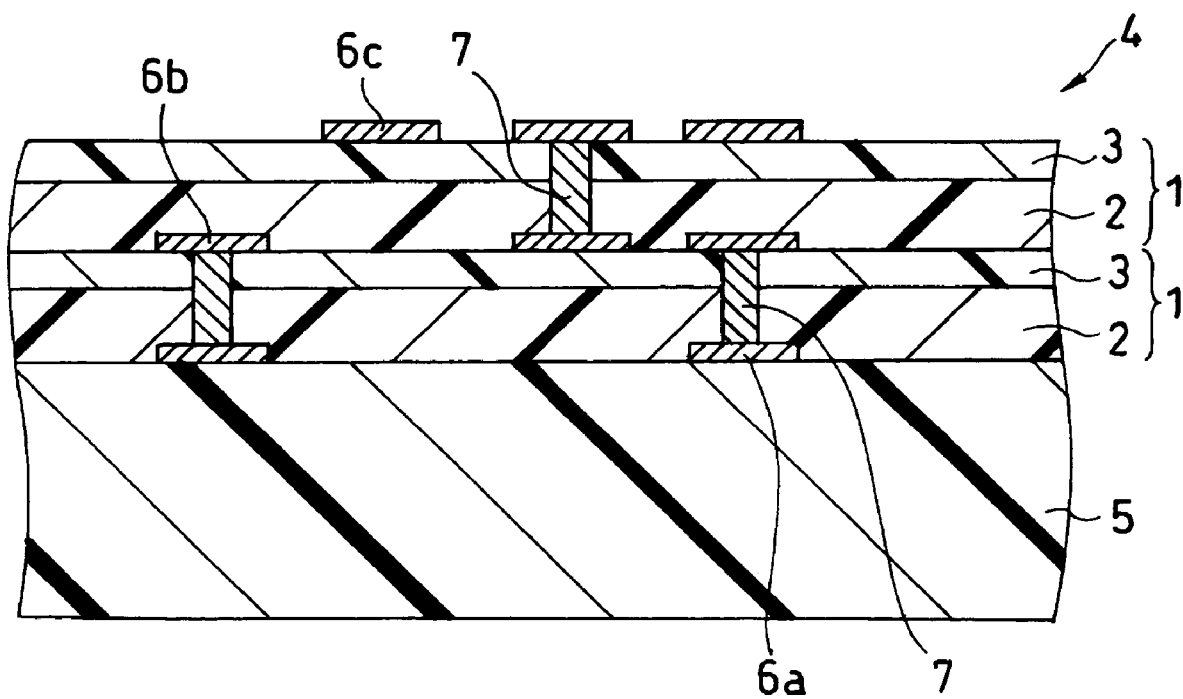
FIG. 2 is a sectional view showing a wiring board according to the first embodiment of the present invention.

Hereinafter, the embodiments of the present invention will be specifically described with reference to the accompanying drawings. A first embodiment of the present invention will be first described. FIG. 1 is a sectional view showing a sheet material according to this embodiment, and FIG. 2 is a sectional view showing a wiring board according to this embodiment. A sheet material 1 according to this embodiment is a film-like or sheet-like material, and is used as an insulating film of a wiring board. As shown in FIG. 1, the sheet material 1 includes: a bonding layer 2 as a first layer; and a high-strength layer 3 laminated on the bonding layer 2 as a second layer. Since the first layer (the bonding layer 2) serves to ensure the adhesion between the sheet material 1 and a substrate or an underlying sheet material, on which the sheet material 1 is deposited, the first layer is hereinafter referred to as a "bonding layer." The bonding layer 2 can be formed of, for example, a thermosetting resin or a thermoplastic resin. In particular, if the bonding layer 2 is formed of a thermosetting resin, a wiring provided on the substrate or another sheet material can be buried because the bonding layer 2 is soft when being laminated. By the thermosetting that follows, the heat resistance necessary for solder joint can be ensured. On the other hand, since the second layer (the high-strength layer 3) serves to ensure the mechanical characteristics required for the sheet material 1, it is hereinafter referred to as a "high-strength layers"). Since a thickness of the sheet material 1 varies depending on the strength required for the wiring board using the sheet material 1 and the number of laminated layers of the sheet material in the wiring board, it is not particularly limited. However, the thickness of the sheet material 1 is, for example, 1 to 100 µm, desirably, 10 to 50 µm. A thickness of the bonding layer 2 is, for example, 5 to 99 µm, and a thickness of the high-strength layer 3 is, for example, 1 to 95 µm.

The bonding layer 2 is made of a thermosetting material cured by heating at a temperature within a predetermined curing temperature range. It is preferred to use a resin having a high heat resistance, a low dielectric constant, and a high strength as a thermosetting material. In this embodiment, an epoxy resin is used as such a thermosetting material. A thermosetting temperature of the epoxy resin is about 100 to 200° C.

The thermosetting material for forming the bonding layer 2 has an elastic modulus of 2.0 GPa or larger at 150° C. If a semiconductor element is mounted on the wiring board made of the sheet material 1, a solder ball, a gold bump, a gold wire bond or the like is connected to the wiring board. At this time, the connection in realized at a melting temperature of the solder or a softening temperature of the metal upon application of an ultrasonic wave. Therefore, if the elastic modulus of the bonding layer 2 is low in a high-temperature ambience, the stiffness of the wiring board becomes unsatisfactory, sometimes failing to ensure the connection. Therefore, the thermosetting material desirably has the elastic modulus of 2.0 GPa or larger at 150° C.

The bonding layer 2 serves as a bonding layer with a substrate (not shown) when the sheet material 1 is adhered to the substrate. On the other hand, the bonding layer 2 serves as a bonding layer with an underlying sheet material when a plurality of layers of the sheet material 1 are deposited or the sheet material 1 is laminated on another sheet material. Since the bonding layer 2 is soft and therefore is easily deformed before being thermally cured, the bonding layer 2 also serves to bury the wiring formed on the substrate or on the underlying sheet material. After the wiring is buried, the shape of the bonding layer 2 is fixed, thereby bonding the sheet material 1 to the substrate or the underlying sheet material.

The high-strength layer 3 is made of a high-strength material excellent in heat resistance as well as in strength. The high-strength material is not softened or deformed at a temperature within the thermosetting temperature range of the epoxy resin forming the bonding layer 2. The high-strength layer has a tensile rupture strength higher than that of the cured epoxy resin, and a tensile rupture strength at 23° C. of 100 MPa or higher, desirably, 200 MPa or higher, more desirably, 300 MPa or higher. A rupture elongation of the high-strength layer 3 is 10% or higher, desirably, 20% or higher, more desirably, 50% or higher. Moreover, assuming that a rupture strength at −65° C. is a (MPa) and that at 150° C. is b (MPa), a ratio (a/b) is 2.5 or less, for example, 0.4 or more. In this embodiment, polyimide is used as a high-strength material for forming the high-strength layer 3. Polyimide used in this embodiment is selected from polyimides of all aromatic groups, thermoplastic polyimides, and polyimides containing a benzophenone skeleton.

Next, a wiring board according to this embodiment will be described. As shown in FIG. 2, a wiring board 4 according to this embodiment includes a printed board 5. The printed board 5 is a substrate using, for example, a material obtained by impregnating a glass cloth such as FR-4 into an epoxy resin as a component. The printed board 5 may be a substrate having a single-layered structure, which is made of an insulating material such as a glass cloth-epoxy composite material described above, or may be a substrate having a multilayered structure including a plurality of laminated layers made of the insulating material. Moreover, a wiring (outer wiring) may be formed on the surface of the substrate. Moreover, if the printed board 5 has a multilayered structure, a wiring (inner wiring) may be formed between the layers. Two layers made of the sheet material 1 are laminated on the printed substrate 5. A wiring 6a is formed on the surface of the printed substrate 5. A wiring 6b is for on the surface of the underlying sheet material 1, whereas a wiring 6c is formed on the surface of the overlying sheet material 1. The wiring 6a is buried in the bonding layer 2 of the underlying sheet material 1, whereas the wiring 6b is buried in the bonding layer 2 of the overlying sheet material 1. A via 7 is formed in the sheet material 1. Through the via 7, the wiring 6a is connected to the wiring 6b, while the wiring 6b is connected to the wiring 6c. The wiring board 4 according to this embodiment is, for example, a buildup wiring board. A semiconductor element (not shown) is mounted on the wiring board 4 so as to form a semiconductor package.

The wiring board 4 is fabricated by first bonding the bonding layer 2 and the high-strength layer 3 to each other and then adhering them onto the printed board 5. Alternatively, an uncured epoxy resin may be applied to the high-strength layer 3 to obtain the semi-cured bonding layer 2. After providing the semi-cured bonding layer 2 on the printed board 5, the bonding layer 2 may be cured. Further alternatively, after an uncured epoxy resin is applied to the printed board 5 so as to be cured to form the bonding layer 2, the high-strength layer 3 may be formed on the bonding layer 2.

Hereinafter, the reasons of numerical restrictions in each of the constituent requirements of the present invention will be described.

Tensile Rupture Strength of 100 MPa of More of the Second Layer at 23° C.

If the tensile rupture strength of the second layer (the high-strength layer 3) is below 100 MPa, the mechanical characteristics required for the sheet material 1 can not be ensured. Therefore, the rupture strength of the second layer at 23° C. is set at 100 MPa or more.

Ratio (a/B) of 2.5 or Less, Assuming that the Rupture Strength of the Second Layer at −65° C. is a (MPa) and that at 150° C. is b (MPa)

If the value of the ratio (a/b) exceeds 2.5, the rupture strength remarkably decreases when the temperature of the sheet material 1 elevates to be high (150° C.). Therefore, even if the sheet material has sufficient strength at a low temperature (−65° C.) and at a normal temperature (23° C.), the strength greatly varies between at a low temperature and at a high temperature. Therefore, there is a possibility that a crack may be generated in the sheet material 1 because it cannot resist against a repeatedly applied thermal stress. Accordingly, the value of the ratio (a/b) is set at 2.5 or less. On the other hand, although the lower limit of the ratio (a/b) is not particularly limited, it is considered that the generation of a crack can be prevented with the ratio of 0.4 or more, which corresponds to an inverse number of the upper limit (2.5). However, there exists no resin having the ratio (a/b) of less than 1.0 at present, and therefore the confirmation through an experiment is not made yet. Ideally, if a medium insulating film is formed of a material whose physical properties do not change at all between at −65° C. and at 150° C., that is, a material having the ratio (a/b) of 1.0, no change in physical properties is induced by a change in temperature. Therefore, the insulating film is not affected by a heat cycle at all. Accordingly, the best reliability can be obtained.

Rupture Elongation of 10% or More of the Second at 23° C.

If the rupture elongation of the second layer (the high-strength layer 3) is less than 10%, the mechanical properties required for the sheet material can not be ensured. Therefore, the rupture elongation of the second layer at 23□ is set at 10% or more.

Elastic Modulus of 2.0 GPa or More of the Second Layer at 150° C.

By setting the elastic modulus at 2.0 GPa or more, the stiffness of the sheet material at a high temperature is ensured. As a result, since the sheet material can be prevented from being excessively deformed by a stress applied to the sheet material, a solder ball provided on the wiring board can be prevented from being broken. Therefore, it is preferable that the elastic modulus of the second layer at 150° C. be 2.0 GPa or more.

In the sheet material and the wiring board according to the present invention, each being constituted as described above, the film-like or sheet-like sheet material 1 includes the bonding layer 2 made of the epoxy resin and the high-strength layer 3 laminated thereon. The high-strength layer 3 is made of polyimide having a tensile rupture strength of 100 MPa or more at 23° C. and a braking elongation of 10% or more. As a result, even if a crack is generated in the bonding layer 2, the development of the crack can be blocked by the high-strength layer 3. Therefore, a serious situation such as the metal wiring breakage by the development of a crack, the breakage of a bump or the like is never brought about.

Moreover, assuming that the rupture strength of the high-strength layer 3 at −65° C. is a (MPa) and that at 150° C. is b (MPa), the ratio (a/b) is 2.5 or less. This value indicates a small difference in mechanical characteristic induced by a difference in temperature. Therefore, the high-strength layer has high resistance against a thermal stress, and therefore can surely prevent the generation and the propagation of a crack by a repeatedly applied thermal stress. As a result, the wiring board 4 can keep high reliability for a long period of time. As described above, the sheet material and the wiring board according to this embodiment have excellent crack resistance and reliability.

Furthermore, since polyimide has a lower dielectric constant and a lower dielectric loss than those of the epoxy resin, the use of polyimide for a part of the laminate board allows a wiring board operable at a high frequency, which can be used without any problems even if the frequency band of a signal to be transmitted through the wiring corresponds to a high frequency band, as in this embodiment. Moreover, if polyimide is porous polyimide, the dielectric constant and the dielectric loss of the insulating film are further lowered. As a result, the wiring board, which can be used in a higher frequency band, can be obtained.

Furthermore, since polyimide generally has high chemical stability, it is advantageous in its high heat resistance and high solvent resistance. On the other hand, its bonding ability to the metal wiring made of a metal such as copper is unsatisfactory. In this embodiment, however, polyimide contains a benzophenone skeleton. Therefore a benzophenone group includes a carbonyl group being a polar group. As a result, the bonding ability with the metal wiring is improved.

Furthermore, for the formation of the sheet material 1, the high-strength layer 3 also serves as a support member of the bonding layer 2. Therefore, in contrast with the case where the sheet material is foamed of an epoxy resin alone, the step of peeling off the support member from the bonding layer 2 after the bonding layer 2 is cured is no longer needed.

The interface between the bonding layer 2 and the high-strength layer 3 is not necessarily present in a definite manner. Specifically, the sheet material 1 may be a graded material having a continuously changing composition between the bonding layer 2 and the high-strength layer 3 or the like. Although the printed board 5 is used as a substrate in this embodiment, a metal substrate made of a metal or an alloy may be used as a substrate. For example, a planar substrate made of copper or a copper alloy may be used. As a result, for example, if the wiring board according to the present invention is used for a GaAs LSI package, the heat radiation can be improved. Moreover, instead of the printed board 5, a ceramic substrate may be used as a substrate.

A second embodiment of the present invention will now be described. In contrast with the above-described first embodiment, a sheet material according to this embodiment includes a film made of copper (a copper foil) on the face of the high-strength layer opposite to the bonding layer side. Specifically, the sheet material according to this embodiment is obtained by adhering an epoxy resin layer to a single-sided copper clad polyimide film. The structure of the sheet material according to this embodiment other than that described above is the same as that of the first embodiment described above. The single-sided copper clad polyimide film may be a so-called double-layered CCL (copper clad Laminate) obtained by directly laminating a copper foil on a polyimide film or may be a so-called triple-layered CCL obtained by laminating a copper foil on a polyimide film through a bonding layer.

Since the sheet material and the wiring board according to the above embodiment constituted as described above include a copper foil on one side of the high-strength layer, a wiring can be formed by a subtractive method when the wiring board is fabricated by using the sheet material. Specifically, by selectively etching away the copper foil, a wiring pattern can be easily formed.

By providing a copper foil on one side of the high-strength layer, a concave portion is formed on the surface of the high-strength layer by transferring a mat face of the copper foil thereto after the copper foil is etched away from the high-strength layer. A depth of the concave portion is 0.1 to 10 µm. Moreover, since a catalyst such as Pd can be adhered to the concave portion, the surface of the high-strength layer can be subjected to electroless plating with the catalyst. As a result, the wiring board can be fabricated by an additive method and a semi-additive method.

Furthermore a lot of high-strength materials have poor reactivity. In the case where a multilayered wiring board is fabricated by laminating a plurality of layers made of the sheet material 1 (see FIG. 1) according to the above-described first embodiment or by laminating another sheet material on the sheet material 1, the adhesion at the interface between the laminated layers sometimes becomes insufficient. Moreover, the adhesion with the metal wiring sometimes becomes unsatisfactory. On the other hand, according to this embodiment, the fine concave portion is formed on the surface of the high-strength layer. As a result, a part of the overlying sheet material or metal wiring flows into the concave portion to form a convex portion. Owing to the anchor effect of the convex portion, the adhesion with the overlying sheet material or metal wiring can be improved. If the depth of the concave portion is less than 0.1 µm, the effect of allowing the adhesion of the catalyst becomes insufficient. At the same time, the anchor effect becomes unsatisfactory. On the other hand, if the depth of the concave portion exceeds 10 µm, the strength of the high-strength layer is lowered when the thickness of the high-strength layer is reduced. As a result, the strength of the sheet material cannot be sometimes ensured. Therefore, it is preferable that the depth of the concave portion be 0.1 to 10 µm. The effects according to this embodiment other than those described above are the same as those described in the above first embodiment.

Figure 3:
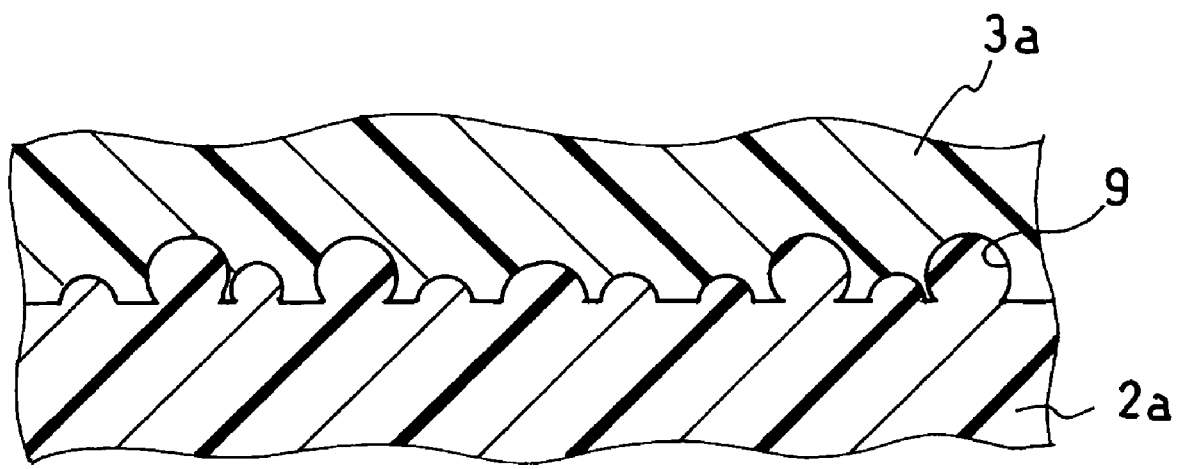
FIG. 3 in a sectional view showing the interface between a bonding layer and a high-strength layer in the third embodiment of the present invention.

A third embodiment of the present invention will now be described. FIG. 3 is a sectional view showing the interface between the bonding layer and the high-strength layer in this embodiment. As shown in FIG. 3, in this third embodiment, fine concave portions 9 are formed on a surface of a high-strength layer 3*a* on the side of a bonding layer 2*a*. A depth of each of the concave portions 9 is 0.1 to 10 µm. An opening area of the concave portion is smaller than its inner sectional area parallel to the surface of the high-strength layer 3*a*. Thus, the convex portion has a "foxhole"-like shape. A ten-point height of irregularities of the high-strength layer 3*a* on the bonding layer 2*a* side is 1 to 5 □m. An epoxy resin for forming the bonding layer 2*a* enters the concave portions 9.

A method of fabricating a sheet material according to this embodiment will be described. First, a copper foil having a mat face at least on one side and including convex portions formed thereon is fabricated. The convex portions are formed by, for example, recrystallizing copper on the surface of the copper foil. Then, liquid polyimide is applied onto the surface of the copper foil so as to be cure in this manner, a single-sided copper clad polyimide film is fabricated. The copper foil is removed by means such as wet etching from the single-sided copper clad polyimide film. As a result, the mat face of the copper foil can be transferred to one side of the polyimide film. Therefore, the high-strength layer 3*a*, on which the concave portions 9 are formed, can be formed. Next, an epoxy resin in a liquid state is applied onto the high-strength layer 3*a*. At this time, the epoxy resin enters the concave portions 9. Next, the epoxy resin is heated so as to be thermally cured. As a result, the sheet material according to this embodiment can be fabricated. The structure according to this embodiment other than that described above is the same as that of the above-described first embodiment.

As described above, a resin having high strength such as polyimide has high chemical stability, sometimes resulting in insufficient adhesion with the bonding layer. On the other hand, in the sheet material and the wiring board constituted as described above according to this embodiment, the fine concave portions are formed on the surface of the high-strength layer on the side of the bonding layer. The resin forming the bonding layer enters the concave portions to form the convex portions. Therefore, the anchor effect owing to the convex portions can be obtained, offering good adhesion between the high-strength layer and the bonding layer. As a result, the sheet material and the wiring board of this embodiment can be formed with good reliability. Moreover, if the concave portions are formed on the surface of the high-strength layer on the wiring side, the characteristics for high-frequency transmission are slightly degraded by skin effect. However, if no concave portion is provided on the wiring side, there is no such problem. The effects in this embodiment other than those described above are the some as those of the above-described first embodiment.

This third embodiment can be carried out in combination with the above-described second embodiment. Specifically, a double-sided copper clad polyimide film may be used to form fine concave portions on both sides of the high-strength layer. As a result, in comparison with the above-described case where the concave portions are formed only on the surface on the bonding layer slide, the characteristics for high-frequency transmission are slightly degraded. However, the adhesion between the high-strength layer and the bonding layer and the adhesion between the high-strength layer and another sheet material and the wiring are improved. At the same time, the sheet material allowing easy formation of the wiring by a substractive method, an additive method or a semi-additive method can be obtained. In the above-described second and third embodiments, the copper foil is removed from the copper clad polyimide film to transfer the mat face of the copper foil so as to form the concave portions on the surface of the high-strength layer. However, the present invention is not limited thereto. The concave portions may be formed by other methods.

Next, a fourth embodiment of the present invention will be described. In this embodiment, the surface of a high-strength layer made of polyimide is subjected to a surface treatment. In some cases, the surface of the high-strength layer, which is in contact with the bonding layer, is subjected to a surface treatment. In the other cases, the surface of the high-strength layer, which is in contact with the metal wiring, is subjected to a surface treatment. There are various treatments as the surface treatment; for example, an ultraviolet-ray irradiation treatment, a plasma treatment, an ion beam treatment, an alkali treatment and the like.

In the ultraviolet-ray irradiation treatment, a wavelength of the ultraviolet ray is not particularly limited. In particular, an ultraviolet ray having a short wavelength at 300 nm or less is radiated to greatly improve the adhesion between the high-strength layer and the bonding layer, another sheet material or the wiring. As examples of such an ultraviolet-ray source, a UV lamp, an excimer lamp and the like can be given. As an example of the excimer lamp, an excimer VUV cleaning machine fabricated by Ushio Inc. can be given. The light source is able to radiate ultraviolet rays at 126 nm, 146 nm, 172 nm, 222 nm and 308 nm, which are close to a short wavelength depending on the model. Although the improved adhesion by radiating such an ultraviolet ray may be attributed to purification by decomposition of an organic deposit on the surface, a chemical reaction on the surface of the material and the like, the details are not clarified yet.

As a plasma treatment, after a gas such as oxygen, nitrogen, or hydrogen fluoride is introduced into a plasma device, the gas is transformed into a plasma. Then, the high-strength layer is subjected to a surface treatment such as etching. In particular, in the case where the high-strength material is polyimide, remarkable effects can be obtained. A gas to be introduced during the plasma treatment is not limited to oxygen, nitrogen or hydrogen fluoride.

In the ion beam treatment, an ion beam is accelerated so as to be radiated onto the surface of the high-strength layer. As a result, in particular, in the case where the high-strength layer is, made of a fluorine-containing polymer as described below, good adhesion with the wiring is obtained.

There is a surface treatment with an aqueous solution such as KOH or NaOH as the alkali treatment. In the case where the high-strength material is polyimide, in particular, the high-strength layer is brought into contact with a strong alkali solution to open an imide ring or polyimide, thereby producing a carboxyl group and an amide group. Since these groups have high reactivity, strong adhesion between the high-strength layer and the bonding layer, another sheet material or the wiring can be obtained.

As described above, in this embodiment, the surface of the high-strength layer is subjected to a surface treatment. As a result, the adhesion between the high-strength layer and the bonding layer, the adhesion between the high-strength layer and another sheet material, and the adhesion between the high-strength layer and the metal wiring can be improved. As a result, besides the results of evaluation by a heat cycle test, those of the reliability tests such as a THB (steady-state Temperature Humidity Bias life test) and a HAST (Highly Accelerated Temperature and Humidity Stress Test) are improved. In the case where the surface of the high-strength layer is subjected to a surface treatment, there is an advantage in that the presence of convexity and concavity formed on the surface of the high-strength layer on the metal wiring side does not cause any problems in high-speed transmission because the convexity and concavity formed on the surface are as small as at the molecular level or close thereto. The effects according to this embodiment other than those describe above are the same as those described in the first embodiment above.

As the surface treatment in this embodiment, any one of the above-described treatments may be carried out or a plurality of treatments may be sequentially carried out.

Next, a fifth embodiment of the present invention will be described. In this embodiment, the high-strength layer is made of a liquid crystal polymer. Examples of the liquid crystal polymers include a liquid crystal polymer having a mesogen group (rigid group) such as azomethine-type, azo-type, ester-type, stilbene-type, biphenyl-type, terphenyl-type, tolan-type, cyclohexane-type, pyrimidine-type, and fluorine-type liquid crystal polymers. These mesogen groups may be present in a side chain of the polymer, but desirably are present in a main chain. The above liquid crystal polymers may be porous. The structure according to this embodiment other than that described above is the same as that described in the first embodiment above.

In the sheet material and the wiring board of this embodiment constituted as described above, a liquid crystal polymer is used as a high-strength material for forming the high-strength layer. As a result, since the liquid crystal polymer has the orientation on the molecular order and therefore has a small thermal expansion coefficient, a material having a thermal expansion coefficient close to that of silicon and a material having a thermal expansion coefficient close to that of a metal such as copper for forming the wiring can be fabricated. For example, by fabricating a material having a thermal expansion coefficient close to that of silicon as the high-strength layer, a difference in thermal expansion coefficient between the wiring board and the semiconductor element is reduced. As a result, the generation of a thermal stress can be kept small when a heat cycle is applied. On the other hand, if a material having a thermal expansion coefficient close to that of a metal is fabricated, a thermal stress between the high-strength layer and the wiring can be reduced. In addition, the liquid crystal polymer has the properties of having small dielectric constant, dielectric loss, and water absorption coefficient or the like. Also in this regard, the liquid crystal polymer is desirable as a material of the wiring board.

The use of a liquid crystal polymer alone as an insulating film of the wiring board is also conceived. However, since a liquid crystal polymer having soldering heat resistance and the like has a high softening point of about 300° C., the use of the liquid crystal polymer is impossible in a normal heat pressing machine having a heating temperature of about 200° C. Moreover, there are other problems such as the difficulty of control in deposition because of a sudden decrease of viscosity in softening and the difficulty of forming a multilayered wiring because an already formed underlying layer is softened and deformed by heat applied to an overlying layer in pressing in the case of a multilayered wiring. On the other hand, in this embodiment, only the high-strength layer is formed of a liquid crystal polymer. The thus formed high-strength layer is laminated on the bonding layer to form a sheet material. Therefore, the bonding with the substrate or the underlying sheet material can be achieved by the bonding layer, and therefore, it is not necessary to heat the high-strength layer made of a liquid crystal polymer to a softening point. Accordingly, the problems which may otherwise arise when the liquid crystal polymer is used alone are not caused.

Next, a sixth embodiment of the present invention will be described. In this embodiment, the bonding layer is made of a composite material obtained by an aramid fiber contained in an epoxy resin. The aramid fiber content in the composite material is, for example, 10 to 50% by weight. In addition, a liquid crystal polymer is used as the high-strength material. The structure in this embodiment other than that described above is the same as that of the fifth embodiment described above.

In the sheet material and the wiring board constituted as described above in this embodiment, the aramid fiber itself contained in the bonding layer has the effect of preventing the generation of a crack. Therefore, if the sheet material is found by the combination of the bonding layer and the high-strength layer, more excellent crack resistance can be obtained. Moreover, since the thermosetting resin containing the aramid fiber has a small thermal expansion coefficient, the use of the epoxy resin containing the aramid fiber as the thermosetting material allows the thermal expansion coefficient of the bonding layer to be almost equal to that of silicon (Si) forming the semiconductor element. As a result, even if a heat cycle is applied, a thermal stress is scarcely generated. Therefore, the wiring board, in which a crack and warp do not occur, can be fabricated. The effects in this embodiment other than those described above are the same as those of the first embodiment described above.

In this embodiment, the matrix of a thermosetting material is not limited to the epoxy resin, other thermosetting resins may also be used. Moreover, a thermosetting resin containing a fluorine-containing polymer may be used as a thermosetting material instead of the thermosetting resin containing the aramid fiber. Although the epoxy resin generally has somewhat large dielectric constant and dielectric loss, this disadvantage is improved by using the epoxy resin, in which the fluorine resin having small dielectric constant and dielectric loss is dispersed. As such a material, for example, there exists a material obtained by impregnating an epoxy resin into stretched PTFE (for example, Microlam 600 fabricated by W. L. Gore and Associates, Inc. or the like).

The thermosetting resin in this embodiment desirably has a dielectric constant and a dielectric loss as small as possible in view or the use of the wiring board in the high-frequency band. Besides the epoxy resins, there exist polyolefin and vinyl resins as such a thermosetting resin. Moreover, a BT resin may be used as the thermosetting resin.

Next, a seventh embodiment of the present invention will be described. In this embodiment, the high-strength layer is formed of a fluorine-containing polymer. The fluorine-containing polymer includes a polymer containing a fluorine atom in a molecular structure. Examples thereof include polytetrafluoroethylene, a tetrafluoroethylene-perfluoroalkyl vinylether copolymer, a tetrafluoroethylene-ethylene copolymer, polychlorotrifluoroethylene, a chlorotrifluoroethylene-ethylene copolymer, polyvinylidene fluoride, and polyvinyl fluoride. These fluorine-containing polymers may be porous. The structure in this embodiment other than that described above is the same as that described in the first embodiment above.

In the sheet material and the wiring board constituted as described above in this embodiment, the high-strength layer is made of a fluorine-containing polymer. The fluorine-containing polymer has the smallest dielectric constant and dielectric loss among the resins, and therefore is a particularly desirable material for a high-speed transmission wiring board using a high frequency. Moreover, since the fluorine-containing polymer provides small strength but remarkably great stretching ability, it has a strong effect of preventing the generation of a crack. However, since the fluorine-containing polymer is hydrophobic, it provides low adhesion with another resin layer and the metal wiring. Therefore, it is desirable to perform the surface treatment described in the above fourth embodiment on the surface of the high-strength layer made of the fluorine-containing polymer.

An eighth embodiment of the present invention will now be described. A sheet material according to this eighth embodiment is the same as the sheet material 1 (see FIG. 1) according to the above-described first embodiment. In this embodiment, for fabricating the wiring board, the sheet material 1 is formed on a metal plate. After the formation of the wirings 6a to 6c and the vias 7, the metal plate is etched away. As a result, the wiring board according to this eighth embodiment is fabricated.

In this embodiment, since the sheet material is formed on the metal plate in the fabrication steps of the wiring board, the metal plate serves as a support substrate. Therefore, the wiring board excellent in evenness can be easily fabricated. The metal plate is removed at the final step, thereby obtaining an extremely thin wiring board without a support substrate. Such a thin wiring board does not have a support substrate which may absorb a thermal stress. Therefore, a generated stress is totally concentrated on the laminated sheet material. Therefore, the sheet material having good crack resistance in this embodiment is particularly effective in this regard. The effects in this embodiment other than those described above are the same as those in the above-described first embodiment.

In this embodiment, it is preferred to form fine concave portions on the surface of the high-strength layer or to perform a surface treatment so as to improve the adhesion with the bonding layer, another sheet material or the wiring as described in the above second to fourth embodiments. The reason for this is as follows. The wiring board in this embodiment does not include a support substrate for absorbing a stress. Therefore, if the sheet material has poor interfacial adhesion, interfacial peeling easily occurs to degrade the characteristics and the reliability of the wiring board.

Figure 4:
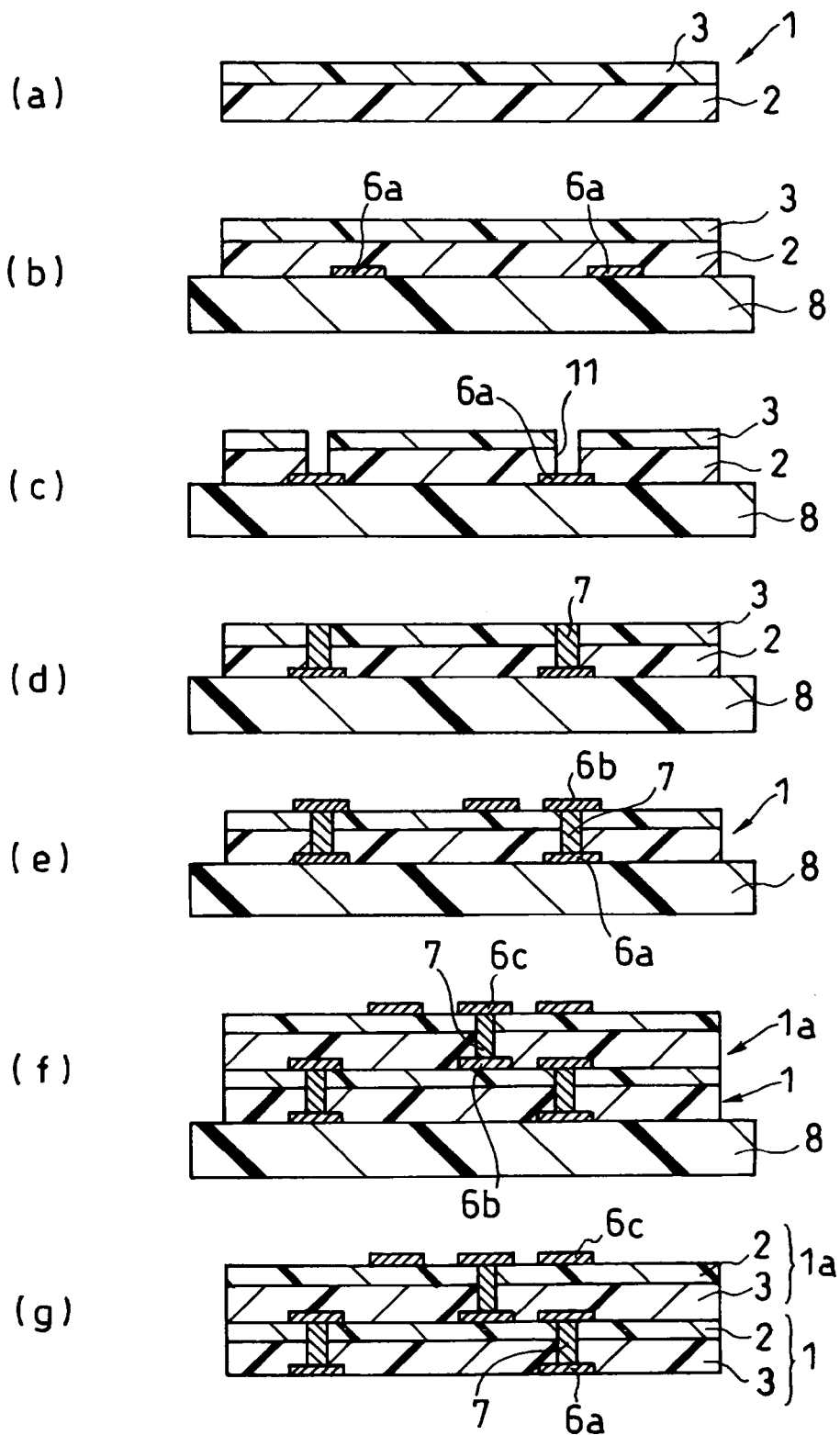
FIGS. 4(a) to 4(g) are sectional views showing a method of fabricating a wiring board according to each of the embodiments in the order of steps.

Next, a method of fabricating the wiring board according to the above-described eighth embodiment will be described. FIGS. 4(a) to 4(g) are sectional views showing a method of fabricating the wiring board according to this embodiment in the order of steps. First, as shown in FIG. 4(a), the bonding layer 2 and the high-strength layer 3 are bonded to each other to fabricate the sheet material 1. At this step, the bonding layer 2 is semi-cured.

Next, as shown in FIG. 4(b), the wiring 6a is formed on the metal plate 8. Then, the sheet material 1 is provided on the metal plate 8 so as to cover the wiring 6a. At this time, the sheet material 1 is provided so that the bonding layer 2 of the sheet material 1 comes into contact with the metal plate 8. As a result, the bonding layer 2 of the sheet material 1 is deformed to bury the wiring 6a. Thereafter, the sheet material is heated to thermally cure the bonding layer 2.

Next, as shown in FIG. 4(c), a via hole 11 is formed by laser processing or the like in a part of a region of the sheet material 1, which is situated directly above the wiring 6a. Next, as shown in FIG. 4(d), the via hole 11 is filled with a conductor layer to form the via 7. Next, as shown in FIG. 4(e), the wiring 6b is formed on the sheet material 1. At this time, the wiring 6b is formed so as to be connected to the wiring 6a through the via 7.

Next, as shown in FIG. 4(f), another sheet material 1 (hereinafter, referred to as a sheet material 1a) is laminated on the sheet material 1 and is then thermally cured. At this time, the bonding layer 2 of the sheet material 1a buries the wiring 6b. Next, the via 7 is formed in part of a region of the sheet material 1a, which is situated directly above the wiring 6b. Then, the wiring 6c is formed on the sheet material 1a. At this time, the wiring 6c is formed so as to be connected to the wiring 6b through the via 7 in the sheet material 1a.

Next, as shown in FIG. 4(g), the metal plate 8 is etched away. As a result, the wiring board according to the eighth embodiment is fabricated.

In the fabrication method shown in FIGS. 4(a) to 4(g), the metal plate 8 in used as a support substrate. However, the support substrate is not particularly limited to a metal plate as long as it has evenness. In addition, the method of removing the support substrate is not limited to etching; methods other than etching such as peeling may be used.

If the wiring board 4 according to the above-described first embodiment is to be fabricated, the sheer materials 1 and 1a are laminated on a printed board instead of the metal plate 8 in the steps shown in FIGS. 4(a) to 4(f). Then, the step shown in FIG. 4(g) is emitted. In this manner, the wiring board 4 shown in FIG. 2 can be fabricated.

In the above-described first to eighth embodiments, a thermoplastic resin can be used in plate of the thermosetting resin.

Hereinafter, examples of the present invention will be specifically described in comparison with comparative examples which do not fall within the scope of the claims of the present invention. The present invention is not limited to the following examples; various modifications and changes are possible within the scope of the technical idea of the present invention.

In the examples and the comparative examples described below, sheet materials, which respectively included high-strength layers made of different materials and had different surface states, were fabricated. By using the sheet materials, twenty samples of wiring boards were fabricated for each of the examples and the comparative examples described below. Ten of the samples were subjected to a heat cycle test in the range of temperature variation of −65 to 150° C. and then were measured for a wiring resistance. The remaining ten samples were subjected to a moisture resistance test (HAST). After elapse of predetermined time, the dynamic peel strength between a high-strength layer and a bonding layer and an insulation resistance were measured. Moreover, the tensile strength of the high-strength layer was also measured. In addition, in some of the examples, the peel strength between the high-strength layer and the wiring was measured.

Hereinafter, the purposes of the heat cycle test and the moisture resistance test and detailed test methods thereof will be described. If the thermal stress resistance of a semiconductor device is evaluated under the conditions of practical use (at 25 to 70° C.), evaluation will take long time. Thus, a heat cycle at (−65 to 150° C.) is applied to the samples so as to perform an accelerated test. Specifically, a heat cycle performed by repeating a basic cycle for predetermined times is applied to the samples. In the basic cycle, after being kept at −65° C. for 30 minutes, the samples are kept at +150° C. for 30 minutes. Since the transition time from a low temperature (−65° C.) to a high temperature (+150° C.) and the transition time from the high temperature to the low temperature differ depending on the performance of a heat cycle test machine and the heat capacity of a sample, the transition time is appropriately adjusted. If a crack is generated in an insulating film by a thermal stress during the heat cycle test to cut the wiring of a wiring board, the wiring resistance increases as compared with before the heat cycle test. Therefore, the measurement of a wiring resistance allows the evaluation of reliability of the wiring board.

Moreover, as described above, a lot of high-strength materials such as polyimide have low adhesion and bonding ability with other materials due to its chemical stability. If a material having such low adhesion and bonding ability is laminated on another material, the strength at the interface between both the materials becomes unsatisfactory. The unsatisfactory bonding strength may be evaluated by itself. However, if water with high polarity exists in the environment where a sample is placed, the water easily enters the interface which provides weak bonding to further lower the bonding strength at the interface as well as to lower the insulation resistance. Therefore, if a sample placed at a high humidity and a high temperature for long time, it is possible to more clearly detect whether the bonding strength is satisfactory or not. As the examples of such a test, a EAST (Highly Accelerated Temperature and Humidity Stress Test, standard; JESD22-A110) and a THB (steady-state Temperature Humidity Bias life test, standard: JESD22-A110-B) can be given. The test standards, JESD, designate "JEDEC Standards," and JEDEC is an acronym for Joint Electron Device Engineering Council (a standard-setting organization for electronic devices in the USA, URL: http://www.jedec.org).

Hereinafter, each of the examples and the comparative examples will be described in details.

EXAMPLE 1

A double-sided copper clad polyimide film (UPISEL N fabricated by Ube Industries Ltd., a thickness of a copper foil: 12 μm, a thickness of polyimide; 25 μm) was used. The copper foils on both sides of the double-sided copper clad polyimide film were dissolved with an alkali copper etchant when the surface of the polyimide film after etching the copper foils was observed with a scanning electron microscope (SEM), fine concave portions formed by transferring the mat faces of the copper foils were observed.

Next, the polyimide film, from which the copper foils were etched, and an epoxy resin material (ABF fabricated by Ajinomoto Co., Inc., a thickness: 40 μm) in a se-cured state (B-stage) were heated at 80° C. so as to be bonded to each other by a vacuum laminating technique, thereby obtaining a sheet material. On the other hand, an Ni-plating layer serving as an etching barrier layer was formed on a copper plate. On the thus formed etching barrier layer, a BGA land made of a double-layered film composed of a gold layer and a copper layer was formed. Then, after the above-described sheet material was laminated and pressed on the copper plate, the copper plate and the sheet material were kept at 170□ for 60 minutes so as to cure the epoxy resin. A part of the sheet material formed on the copper plate was cut out for observation of its cross section.

Figure 5:
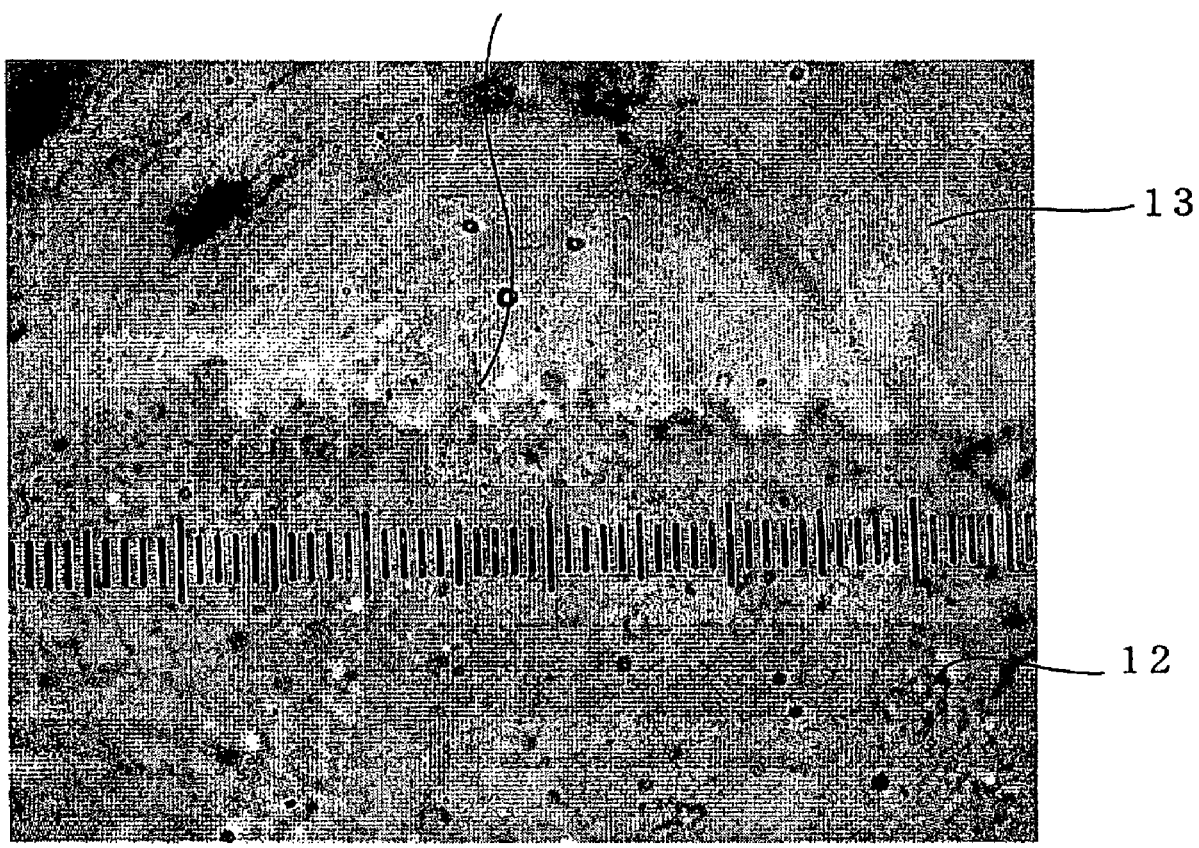
FIG. 5 is a picture substituted for a drawing, showing the interface between a polyimide layer and an epoxy resin layer in a sheet material (an optical micrograph at 2000 magnifications)
Figure 6:
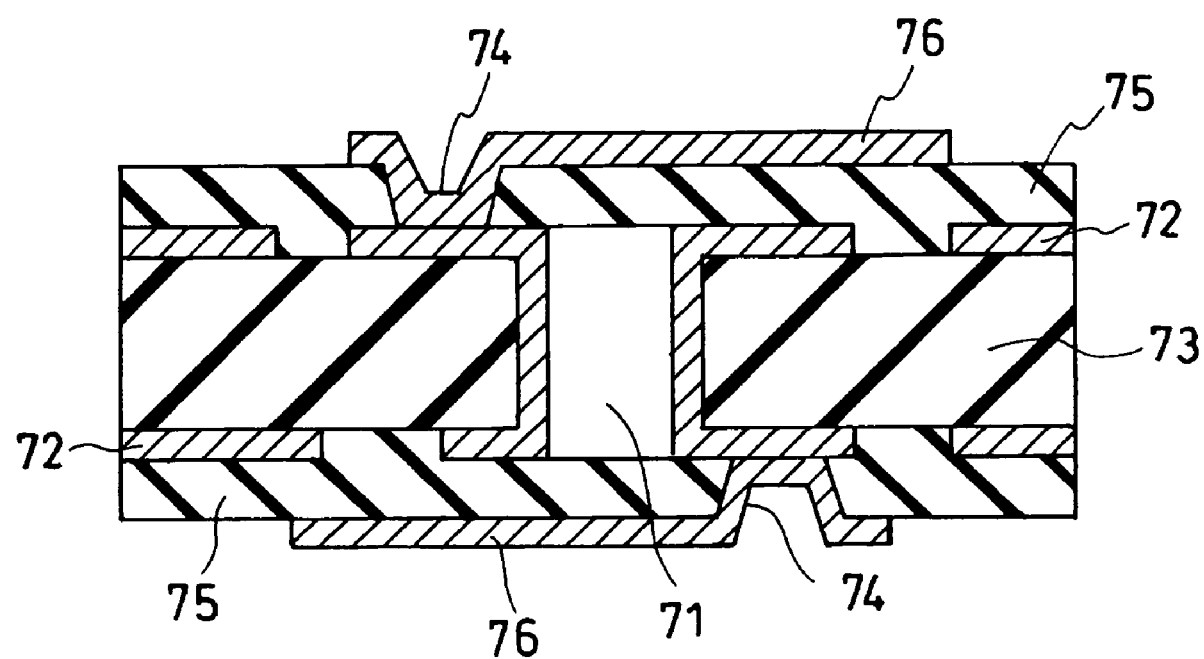
FIG. 6 is a sectional view showing a conventional buildup printed wiring board.

FIG. 5 is an optical micrograph of the cross section showing the interface between the polyimide layer and the epoxy resin layer in the sheet material. FIG. 5 also shows a scale whose minimum unit is 1 μm. As shown in FIG. 5, foxhole-shaped concave portions 14 were formed on a polyimide layer 13 at the interface between the polyimide layer 13 serving as a high-strength layer and an epoxy resin layer 12 serving as a bonding layer. An epoxy resin flowed into the concave portions 14 so that the epoxy resin layer 12 protruded into the polyimide layer 13. Although the polyimide layer 13 and the epoxy resin layer 12 were attempted to be separated from each other in this state, they could not be separated from each other cause they were firmly bonded to each other.

Next, after formation of a via in the sheet material on the copper plate by a carbon dioxide gas laser, a desmear process was followed by electroless plating using palladium as a catalyst. As a result, a uniform electroless plating layer was formed on the surface of the sheet and the side face of the via, which were in contact with a plating solution. A pattern was formed on a sample, on which the electroless plating layer was formed, by using a plating resist so as to form a wiring having a thickness of about 18 μm by electroplating as well as to fill the via by plating. Next, an unnecessary electroless plating layer was selectively etched away.

By repeating the above-described steps, a multilayered wiring board was fabricated. Next, test semiconductor elements were mounted on the thus fabricated wiring board by flip chip bonding. Thereafter, the underlying copper plate was etched away. Subsequently, the Ni layer serving as the etching barrier layer was also removed. By the above-described steps, the wiring board, on which the semiconductor elements were mounted, was obtained. A TEG (test element group) area with a via and a wiring for a HAST test was provided in the area of the fabricated wiring board, where the semiconductor elements were not mounted.

After a solder ball was provided in the BGA land of the wiring board, the wiring board was cut for individual semiconductor elements to obtain test samples. Ten of the test samples were used for a heat cycle test in the temperature variation range or −65 to 150° C. As a result, an increase in wiring resistance due to wiring breakage or the like was not generated even after 1000 heat cycles.

The HAST test (a temperature; 130° C., a humidity; 85% RH, and an applied voltage: 5V) was performed on the remaining ten samples. The EAST test was performed for the insulation resistance between the vias (via/land diameters 90/150 μm, a via pitch: 300 μm). In the HAST test, problems such as a drop in insulation resistance value were not generated even after elapse of 400 hours. Moreover, the polyimide layer and the epoxy resin layer were attempted to be separated from each other for the samples after the EAST test. However, since the polyimide layer and the epoxy resin layer were firmly bonded to each other, they could not be separated from each other.

A sheet material on another copper plate, on which an electroless plating layer was formed, was subjected to panel plating by electroplating so as to form a copper layer having a thickness of about 18 μm. After the copper layer was removed so as to leave a rectangular band having a width of 10 mm, a 90 degree peel strength (a peel strength according to JIS C6481) was measured. The peel strength was 1.5 kN/m.

A rectangular band having a width of 10 mm was cut out from the used polyimide after etching the copper foils for tensile measurement. The tensile test was according to "JPCA standards, Buildup wiring board, JPCA-BU01." As a result, a rupture extension was 78% (at 23° C.), and tensile strengths were 450 MPa (at 23° C.), 480 MPa (at −65° C.) and 350 MPa (at 150° C.). Therefore, the above-mentioned (a/b) ratio, that is, a ratio of the tensile rupture strength a at −65° C. to a tensile rupture strength b at 150° C. was 1.37.

EXAMPLE 2

Only one side of a double-sided copper clad polyimide film was covered with a protective film so that only a copper foil on the other side was removed with the same etchant as that in Example 1. The thickness and the mechanical properties of the polyimide film were the same as those of the polyimide film in Example 1 described above. An epoxy resin (Probicote fabricated by Nippon Paint Co., Ltd., a thickness: 50 μm) in a semi-cured state was vacuum-laminated on the side of the polyimide film, from which the copper foil was etched away, thereby obtaining a laminate sheet material.

The laminate material war laminated and pressed on the same copper plate as that in Example 1 so as to obtain a sheet material formed on the copper plate. Next, the remaining copper foil was patterned so as to farm a wiring by a subtractive method. Next, after semiconductor elements were mounted, the copper plate was etched away to fabricate a wiring board.

As in Example 1, the epoxy resin layer protruded into the concave portions formed on the surface of the polyimide film in this Example. Therefore, the epoxy resin layer and the polyimide film could not be separated from each other.

As in Example 1, the heat cycle test and the HAST test were conducted. Even after 1000 heat cycles, an increase in wiring resistance due to wiring breakage or the like was not generated. In addition, even after elapse of 400 hours in the HAST test, problems such as a drop in insulation resistance value were not caused. Furthermore, the polyimide film and the epoxy resin layer were attempted to be separated from each other in the samples after the HAST test. However, since the polyimide film and the epoxy resin layer were firmly bonded to each other, they Could not be separated from each other.

In the above Examples 1 and 2, the case where the wiring board formed on the metal plate which was removed at the final step has been described. This is because the wiring board composed simply of the insulating film made of the sheet material and the wiring board, which is obtained by removing the metal plate at the final step, is more greatly affected by a thermal stress generated when a semiconductor element or the like is mounted as compared with a wiring board including a core substrate. Specifically, since a generated thermal stress has to be absorbed by a thin insulating film, the insulating film is required to have a large rupture strength and the like. This means any material, which can be used for a wiring board obtained by removing a metal plate at the final step, can also be substantially used for a wiring board including a core substrate such as a printed board. However, if a semiconductor element, which has a different linear expansion coefficient from that of the sheer material and includes a large number of pins, is mounted on a wiring board including a core substrate such as a printed wiring board, there is a possibility that a crack may be generated at the interface between the sheet material and the metal wiring and another different kind of material as a starting point. Therefore, a sheet material having high crack resistance as described in the present invention is effective. Hereinafter, a wiring board including a printed board will be described as Example 3.

EXAMPLE 3

A laminate sheet material fabricated in the same manner as in Example 1 was laminated and pressed on an FR-4 substrate including a printed wiring. The laminated sheet material and the FR-4 substrate were kept at 170° C. for 80 minutes to cure a lower layer made of an epoxy resin included in the sheet material, thereby bonding the sheet material and the FR-4 substrate to each other. A part of the laminate material including the FR-4 substrate was cut out for the observation of its cross section. As a result, it was found that the epoxy resin layer protruded into the concave portions of the polyimide film. Although the polyimide layer and the epoxy resin layer were attempted to be separated from each other in this state, they could not be separated from each other because they were firmly bonded to each other.

After formation of a via in the sheet material on the FR-4 substrate by a laser, a desmear process was performed. Then, electroless plating using palladium as a catalyst was performed. As a result, an electroplating underlayer made of an electroless plating layer was formed on the upper face of the sheet material and the inner face of the via.

Next, a wiring pattern was formed on the sample including the thus formed plating underlayer by using a resist. Then, electroplating was performed to remove the resist so as to obtain a wiring in a desired pattern as well as to fill the via by plating. A thickness of the wiring was regulated to be about 18 □m. Thereafter, an unnecessary electroless plating layer was selectively removed.

By repeating the above-described steps, a multilayered substrate was fabricated. Then, semiconductor elements were mounted on the multilayered substrate by flip-chip bonding. As a result, a wiring board, on which the semiconductor elements were mounted, was obtained.

The multilayered wiring board was cut for individual semiconductor elements so as to obtain test samples. Twenty of the thus obtained test sample were subjected to a heat cycle test (at −65° C. to 150° C.). Even after 1000 cycles, problems such as wiring breakage did not occur.

EXAMPLE 4

As a thermosetting resin, a semi-cured thermosetting material containing an aramid fiber as a reinforcing medium and an epoxy resin as a matrix (EA541 fabricated by Shin-Kobe Electric Machinery Co., Ltd.; containing an aramid fiber at 30% by weight) was used A wiring board was fabricated in otherwise the same manner as that in Example 1. Specifically, a polyimide film used in this Example was the same as that used in Example 1 described above.

Even in the wiring board of this Example, a bonding layer protruded into the concave portions of the polyimide layer. Therefore the polyimide layer and the bonding layer could not be separated from each other. For the heat cycle test, after 1000 cycles, problems such as wiring breakage did not occur. Moreover even after elapse of 400 hours in the HAST test, problems such as a drop in insulation resistance value did not occur.

EXAMPLE 5

As a thermosetting resin, a thermosetting material made of a semi-cured thermosetting material obtained by impregnating an epoxy resin in a stretched porous fluorine-containing polymer (polytetrafluoroethylene) (Microlam fabricated by W. L. Gore and Associates, Inc., containing a fluorine-containing polymer at 25%) was used to fabricate a wiring board. The structure of the wiring board of Example 5 other than that described above was the same as that of example 1 described above. Specifically, a polyimide film used in this Example was the same as that of a polyimide film used in Example 1 described above. Even in the wiring board of this Example, the bonding layer protruded into the concave portions on the polyimide layer. Therefore, the polyimide layer and the bonding layer could not be separated from each other. After 1000 cycles of the heat cycle test, problems such as wiring breakage did not occur.

EXAMPLE 6

As polyimide containing a benzophenone skeleton, a poly[N,N'-(1,4-phenylene)–3,3',4,4'-benzophenonetetracarboxyl imide] (an Aldrich reagent) was applied onto PTFE by a bar coater and was then dried to form a polyimide film. Thereafter, the polyimide film was peeled off from PTFE. As a result, a polyimide film (a film thickness: 20 μm) containing a benzophenone skeleton used for the second layer was obtained. The obtained polyimide film had substantially even surface on both sides. The polyimide film and a semi-cured epoxy resin material (ABF fabricated by Ajinomoto Co., Inc., a thickness; 40 □m) were heated at 80□ to be bonded to each other by vacuum laminating to obtain a sheet material. Samples were obtained from the sheet material so as to be subjected to the peel strength test between the polyimide layer and the epoxy resin layer, the heat cycle test and the EAST test, the peel strength test between the polyimide layer and the wiring, and the tensile test of the polyimide film.

In the peel strength test between the polyimide layer and the epoxy resin layer, the above-described sheet material was laminated and pressed on a copper plate. Then, they were kept at 170° C. for 60 minutes to cure the epoxy resin. Thereafter, the peel strength between the polyimide layer and the epoxy resin layer was attempted to be measured in the sa manner as in Example 1. However, since the polyimide layer and the epoxy resin layer were firmly bonded to each other, they could not be separated from each other.

On the other hand, in the heat cycle test and the HAST test, as in Example 1, a BGA land was formed on a copper plate. On the copper plate, the above-described laminated sheet material was laminated and pressed. They were kept at 170° C. for 60 minutes to cure the epoxy resin so as to obtain an insulating film made of a sheet material formed on the copper plate. Then, a metal layer was formed on the insulating film by sputtering. The metal layer had a double-layered structure composed of a lower layer for bonding and an upper layer made of copper. Next, electroless plating was performed using the metal layer as a seed layer to form a wiring. Thereafter, in the same method as in the above-described Example 1, a wiring board, on which semiconductor elements were mounted, was fabricated. Then, a solder ball was mounted on the BGA land.

Next, the wiring board was cut for individual semiconductor elements to obtain test samples. Thereafter, the heat cycle test and the HAST test were carried out as in Example 1. As a result, in the heat cycle test, no increase in wiring resistance due to wiring breakage occurred even after 800 cycles. In the HAST test, problems such as a drop in insulation resistance value did not occur even after elapse of 400 hours. The polyimide film and the epoxy resin layer were attempted to be separated from each other for the samples after the HAST test. However, since the polyimide film and the epoxy resin layer were firmly bonded to each other, they could not be separated from each other.

Moreover, in the peel strength test between the polyimide layer and the wiring, the sheet material was laminated on a copper plate as in Example 1. Then, they were kept at 170° C. for 60 minutes so as to cure the sheet material. Thereafter, a thin film made of copper was formed by sputtering. A copper foil having a thickness or about 18 μm was formed by electroplating using the copper thin film as a seed layer. In the same method as in Example 1, the peel strength between the polyimide layer and the copper foil was measured. As a result, the peel strength was 1.2 kN/m.

The used polyimide film containing a benzophenone skeleton was cut into rectangular bands, each having a width of 10 mm, for tensile measurement. The rupture extension was 19% (at 23° C.), and the tensile strengths were 170 MPa (at 23° C.), 190 MPa (at −65° C.) and 79 MPa (at 150° C.). Therefore, the above-described (a/b) ratio was 2.41.

EXAMPLE 7

A liquid crystal polymer with a copper foil, which included a copper foil formed on one side, (ESPANEX fabricated by Nippon steel Chemical Co., Ltd.) was used as a high-strength material. A thickness of the liquid crystal polymer layer was 25 μm, and a thickness of the copper foil was 18 μm. After a wiring board was fabricated in otherwise the same manner as in Example 1, the tests were carried out. In the heat cycle test, problems such as wiring breakage did not occur even after 900 cycles. In the HAST test (at 120° C. and 85% RH), no problem occurred even after 400 hours. The peel strength of the copper foil was 1.2 kN/m.

The tensile rupture strength of the liquid crystal polymer layer after removal of the copper foil was measured. As a result, the rupture extension was 28% (at 23° C.), and the tensile rupture strengths were 190 MPa (at 23° C.), 230 MPa (at −65° C.) and 120 MPa (at 150° C.). Therefore, the above-described (a/b) ratio was 1.92.

EXAMPLE 8

A polyimide film (UPILEX fabricated by Ube Industries Ltd., at a thickness of 25 μm) was prepared as a high-strength material. The polyimide film was cut into rectangular bands, each having a width of 1 cm, for tensile measurement. As a result, the rupture extension was 120% (at 23° C.), and the tensile rupture strengths were 270 MPa (at 23° C.), 310 MPa (at −65° C.) and 210 MPa (at 150° C.). Therefore, the above-described (a/b) ratio was 1.48.

Three polyimide films described above were prepared. One of them was subjected to ultraviolet-ray irradiation, one is subjected to a plasma treatment, and the other was left untreated. Thereafter, an epoxy resin in a semi-cured state (ABF fabricated by Ajinomoto Co., Inc.) was vacuum-laminated with each of the polyimide films to obtain a laminate sheet material. For the ultraviolet-ray irradiation, the polyimide film was irradiated with an excimer UV lamp (fabricated by Ushio Inc., a center wavelength: 172 nm) for 2 minutes. In the plasma treatment, the polyimide film was treated with an oxygen plasma at 45° C. for 3 minutes. Samples were cut out from the thus fabricated three kinds of sheet materials so as to be subjected to the peel strength test between the polyimide layer and the epoxy resin layer, the heat cycle reliability test, and the peel strength test between the wiring and the polyimide layer.

In the peel strength test between the polyimide layer and the epoxy resin layer, the obtained sheet material was laminated and pressed on a copper plate. Then, after they were kept at 170° C. for 60 minutes to cure the epoxy resin, the peel strength between the polyimide and the epoxy resin was measured. As a result, the untreated sample had a peel strength of 0.6 kN/m. For the ultraviolet-treated sample and the plasma-treated sample, since the polyimide layer and the epoxy resin layer were firmly bonded to each other, they could not be separated from each other. In this case, the peel strength was estimated to be 2 kN/m or more.

On the other hand, in the heat cycle reliability test, a BGA land was formed on a copper plate as in Example 1. Each of the sheet materials was laminated and pressed on the copper plate. They were kept at 170° C. for 60 minutes to cure the epoxy resin, thereby obtaining an insulating film. Then, a wiring board, on which semiconductor elements were mounted, was fabricated and a solder ball was mounted on a BGA land in the same manner as in Example 1 except that a metal layer formed by sputtering was used as a seed layer for electroplating in place of an electroless plating layer. The metal layer made by sputtering had a double-layered structure composed of a lower layer made of a metal for bonding and an upper layer made of copper.

Next, the thus fabricated wiring board was cut for individual semiconductor elements to obtain test samples. Thereafter, the heat cycle test and the HAST test were carried out as in Example 1. For untreated samples, a wiring resistance was increased in one sample after 800 heat cycles and after 900 heat cycles, respectively. However, any increase in wiring resistance due to wiring breakage or the like was observed even after 1000 heat cycles in the remaining eight samples. In two of the untreated samples, a 10% drop in insulation resistance value was observed after elapse of 350 hours in the EAST test. However, problems such as a drop in insulation resistance value or the like did not occur in the remaining 8 samples. For each of the samples after the HAST test, the polyimide film and the epoxy resin layer were attempted to be separated from each other. For the ultraviolet-treated samples and the plasma-treated samples, both the layers were firmly bonded to each other. Therefore, they could not be separated from each other. For the untreated samples, a drop in bonding strength was observed as compared with before the HAST test.

In the peel test between the wiring and the polyimide layer, a seed layer was formed by sputtering on the polyimide layer in the above-described sheet material. Thereafter, panel plating was performed by electroplating to form a copper layer having a thickness of about 18 μm. The copper layer was selectively removed to leave a rectangular band having a width of 10 mm so as to measure a 90-degree peel strength (peeling strength). As a result, the peel strength was 1.0 kN/m for the ultraviolet-treated samples and 1.2 kN/m for the plasma-treated samples.

EXAMPLE 9

A wiring board was fabricated and evaluated in the same manner as in Example 8 except that a polyimide film (KAPTON fabricated by DU PONT-TORAY CO., LTD.) was used as a high-strength material and an alkali treatment was used as a surface treatment method. The used polyimide film was subjected to tensile measurement. As a result, the rupture extension was 45% (at 23° C.), and the tensile rupture strengths were 280 MPa (at 23° C.), 320 MPa (at −65° C.) and 230 MPa (at 150° C.). Therefore, the above-described (a/b) ratio was 1.39.

The alkali treatment was carried out by impregnating each sample into an aqueous sodium hydroxide solution having a temperature of 50° C. and a concentration of 5N for 10 minutes. After the alkali treatment, the peel strength between the polyimide layer and the epoxy resin layer was measured. As a result, for untreated samples, which were not alkali-treated, the peel strength was 0.4 kN/m. On the other hand, for alkali-treated samples, the polyimide layer and the epoxy resin layer were firmly bonded to each other. Therefore, they could not be separated from each other.

On the other hand, a wiring board, on which semiconductor elements were mounted, was fabricated in the same manner as in Example 8 so as to be subjected to the heat cycle test and the HAST test. Problems such as wiring breakage did not occur in any or alkali-treated samples after 1000 cycles. In addition, no problem occurred after elapse of 400 hours in the HAST test. The peel strength of the copper layer in the alkali-treated samples was 0.9 kN/m.

EXAMPLE 10

Ultraviolet-ray irradiation was performed in the same manner as in Example 8 using porous polyimide (fabricated by Nitto Denko Corporation) as a high-strength material so as to fabricate a wiring board. The conditions in this Example other than those described above are the same as those in Example 8 above. As a result of the heat cycle test, problems such as wiring breakage did not occur even after 800 cycles. Moreover, as a result of the HAST test, no problem occurred even after elapse of 500 hours.

The tensile characteristic of the porous polyimide film used in this Example were as follows. The rupture extension was 15%, and the tensile rupture strengths were 130 MPa (at 23° C.), 150 MPa (at −65° C.) and 95 MPa (at 150° C.). Therefore, the above-described (a/b) ratio was 1.57.

COMPARATIVE EXAMPLE 1

An epoxy resin film (ABF-SH fabricated by Ajinomoto Co., Inc., a thickness; 60 μm) was used as a wiring board insulating material. The epoxy film was cut into rectangular bands, each having a width of 1 cm. As a result of tensile measurement, the rupture extension was 5.9% (at 23° C.), and the tensile rupture strengths were 64 MPa (at 23° C.), 130 MPa (at −65° C.) and 25 MPa (at 150° C.). Therefore, the above-described (a/b) ratio was 5.2.

A wiring board, on which semiconductor elements were mounted, was fabricated in the same manner as in Example 1 except that the single-layered epoxy resin film was used as a sheet material. The wiring board was cut for individual semiconductor elements to obtain test samples. Then, in the same manner as in Example 1, ten samples were subjected to the heat cycle test and the HAST test, respectively.

In the heat cycle test, the wiring resistance value increased in all the samples after 200 to 400 cycles. After the test, the sample was cut so as to observe its cross section. As a result, it was observed that a crack generated in the vicinity of a land to develop into the insulating layer cut the metal wiring. In the HAST test, a drop in insulation resistance or the like was not observed even after 400 hours.

COMPARATIVE EXAMPLE 2

A high-strength material obtained by laminating and pressing electrolytic copper foils, each including a mat face, on a polyimide insulating resin film (BUR-201 fabricated by Asahi Denka Co., Ltd., a thickness: 40 μm) was used as a wiring board material. The copper foils on both sides of the polyimide film were dissolved with an alkali copper etchant. A surface of the polyimide film after etching the copper foils was observed with a scanning electron microscope (SEM). As a result, fine concave portions formed by transferring the mat faces of the copper foils were observed.

The used polyimide film (after etching the copper foils) was cut into rectangular bands, each having a width of 10 mm, so as to measure tensile strengths. As a result, the rupture extension was 8% (at 23° C.), and the tensile rupture strengths were 80 MPa (at 23° C.), 120 MPa (at −65° C.) and 42 MPa (at 150° C.). Therefore, the above-described (a/b) ratio was 2.86. The polyimide film in this Comparative Example has lower tensile strengths than those of the polyimide film in Example 1. Generally, the strength of polyimide depends on a molecular structure. If a molecular structure is linear, strength tends to be high. If a molecular structure is three-dimensional, strength tends to be low.

The polyimide film after etching the copper foils and an epoxy resin (ABF fabricated by Ajinomoto Co., Inc., a thickness: 40 μm) in a semi-cured state were bonded to each other by vacuum laminating to obtain a sheet material. The thus obtained sheet material was used to fabricate a wiring board, on which semiconductor elements were mounted, in the same manner as in Example 1.

After mounting a solder ball on a BGA land of the wiring board, the wiring board was cut for individual semiconductor elements to obtain test samples. Thereafter, the heat cycle test and the HAST test were carried out for 10 samples, respectively, as in Example 1.

For the heat cycle test, after 400 cycles, a wiring resistance value started increasing in some samples. After 700 cycles, all the samples had a high resistance value. When the sample was cut so as to observe its cross section after the test, it was observed that a crack generated from the vicinity of the land to develop into the insulating film penetrated through the polyimide to cut the metal wiring.

For the HAST test, after elapse of 200 hours, a drop in insulation resistance value was observed. After elapse of 400 hours, the insulation resistance value dropped to about $1\times10^{-3}$ to $1\times10^{-6}$ times as small as the insulation resistance value before the HAST test.

COMPARATIVE EXAMPLE 3

A liquid crystal polymer film with copper foils (fabricated by W. L. Gore and Associates, Inc.; a thickness of a copper foil: 12 μm, a thickness of a liquid crystal polymer: 25 μm) was used as a high-strength material. After the copper foils were etched away from the liquid crystal polymer film, the liquid crystal polymer film was cut into rectangular bands, each having a width of 10 mm, for tensile measurement. As a result, the rupture extension was 9% (at 23° C.) and the tensile rupture strengths were 81 MPa (at 23° C.), 130 MPa (at −65° C.) and 32 MPa (at 150° C.). Therefore, the above-described (a/b) ratio was 4.06.

On the other hand, after the copper foils were dissolved with a copper etchant, an epoxy resin material (ABF fabricated by Ajinomoto Co., Inc., a thickness 40 μm) in a semi-cured state were bonded by vacuum-laminating to obtain a sheet material. The thus obtained sheet material was used to fabricate a wiring board, on which semiconductor elements were mounted, in the same manner as in Example 1.

After mounting a solder ball on a BGA land of the wiring board, the wiring board was cut for individual semiconductor elements to obtain test samples. Thereafter, the heat cycle test and the HAST test were carried out for 10 samples, respectively, as in Example 1.

For the heat cycle test, a wiring resistance value started increasing in some samples after 300 cycles. After 700 cycles, all the samples had a high resistance value. When the sample was cut so an to observe its cross section after the test, it was observed that a crack generated from the vicinity of the land to develop into the insulating film penetrated through the liquid crystal polymer to cut the metal wiring.

In the HAST test, after elapse of 300 hours, a drop in insulation resistance value was observed. After elapse of 400 hours, the insulation resistance value of the samples was about 0.1 time as small as that before the HAST test.

INDUSTRIAL APPLICABILITY

The present invention relates to a sheet material used as an insulating film of a wiring board, on which a semiconductor element is mounted, and a wiring board using the sheet material.

The invention claimed is:

1. A sheet material used as an insulating film of a wiring board, comprising:
   a first layer made of a first insulating material wherein the first insulating material contains an aramid fiber or a fluorine-containing polymer; and
   a second layer laminated on the first layer, the second layer being made of a second insulating material which is porous polyimide, the second insulating material having a tensile rupture strength of 100 MPa or more at 23° C. and a tensile rupture elongation of 10% or more at 23° C. and providing a ratio (a/b) of 2.5 or less, assuming that a tensile rupture strength of the second layer at −65° C. is a (MPa) and a tensile rupture strength at 150° C. is b (MPa);
   wherein the polyimide contains a benzophenone skeleton.

2. A sheet material used as an insulating film of a wiring board, comprising:
   a first layer made of a first insulating material wherein the first insulating material contains an aramid fiber or a fluorine-containing polymer; and a second layer laminated on the first layer, the second layer being made of a second insulating material selected from the group consisting of a porous polyimide, porous liquid crystal polymer, and porous fluorine-containing polymer, the second insulating material having a tensile rupture strength of 100 MPa or more at 23° C., a tensile rupture elongation of 10% or more at 23° C., and providing a ratio (a/b) of 2.5 or less, and wherein a tensile rupture strength of the second layer at −65° C. is a (MPa) and a tensile rupture strength at 150° C. is b (MPa).

3. The sheet material according to claim 1, wherein the second insulating material is a liquid crystal polymer.

4. The sheet material according to claim 1, wherein the second insulating material is a fluorine-containing polymer.

5. The sheet material according to claim 1, wherein the first insulating material is a thermosetting material which is cured at a temperature within a predetermined curing temperature range and the second insulating material is a heat resistant material witch is not softened at a temperature within the predetermined curing temperature range.

6. The sheet material according to claim 1, wherein the first insulating material has an elastic modulus of 2.0 GPa or higher at 150° C.

7. The sheet material according to claim 1, wherein at least part of the surface of the second layer is subjected to an ultraviolet-ray irradiation treatment.

8. The sheet material according to claim 1, wherein at least part of the surface of the second layer is subjected to a plasma treatment.

9. The sheet material according to claim 1, wherein at least part of the surface of the second layer is subjected to an ion beam treatment.

10. The sheet material according to claim 1, wherein at least part of the surface of the second layer is subjected to an alkali treatment.

11. The sheet material according to claim 1, comprising a third layer made of a metal or an alloy, the third layer being adjacent to the first layer, said first layer being sandwiched between said second layer and said third layer.

12. The sheet material according to claim 1, wherein a plurality of layers of at least one of the first layer and the second layer is provided, and the first and second layers are alternately laminated with each other.

13. A wiring board comprising a substrate and the sheet material according to claim 1 provided on the substrate.

14. The wiring board according to claim 13, wherein the substrate is a printed board.

15. The wiring board according to claim 13, wherein the substrate is made of a metal or an alloy.

16. The wiring board according to claim 13, wherein the first layer is laminated on the substrate and then the second layer is laminated on the first layer.

17. The wiring board according to claim 13, wherein the sheet material is formed by laminating the first layer and the second layer together, and then the sheet material covers the substrate with the first layer being adjacent to the substrate.

18. A wiring board comprising the sheet material according to claim 1, and produced by fanning the sheet material on a metal plate and ten removing the metal plate.

19. A sheet material used as an insulating film of a wiring board, comprising:
a first layer made of a first insulating material wherein the first insulating material contains an aramid fiber or a fluorine-containing polymer
a second layer laminated on the first layer, the second layer being made of a second insulating material selected from a group consisting of porous polyimide, porous liquid crystal polymer, and fluorine-containing polymer, the second insulating material having a tensile rupture strength of 100 MPa or more at 23° C. and a tensile rupture elongation of 10% or more at 23° C. and providing a ratio (a/b) of 2.5 or less, assuming that a tensile rupture strength of the second layer at −65° C. is a (MPa) and a tensile rupture strength at 150° C. is b (MPa);
wherein a plurality of concave portions having a depth of 0.1 to 10 μm are formed on a surface of the second layer, wherein the surface is not in contact with the first layer, and an opening area of each of the concave portions is smaller than an inner sectional area parallel to the surface of the second layer.

20. A sheet material, used as an insulating film of a wiring board, comprising:
a first layer made of a first insulating material wherein the first insulating material contains an aramid fiber or a fluorine-containing polymer; and
a second layer laminated on the first layer, the second layer being made of a second insulating material selected from a group consisting of porous polyimide, porous liquid crystal polymer, and porous fluorine-containing polymer, the second insulating material having a tensile rupture strength of 100 MPa or more at 23° C. and a tensile rupture elongation of 10% or more at 23° C. and providing a ratio (a/b) of 2.5 or less, assuming that a tensile rupture strength of the second layer at −65° C. is a (MPa) and a tensile rupture strength at 150° C. is b (MPa);
wherein a plurality of concave portions having a depth of 0.1 to 10 μm are formed on a surface of the second layer, which is in contact with the first layer, and an opening area of each of the concave portions is smaller than an inner sectional area parallel to the surface of the second layer.

21. The sheet material according to claim 20, wherein the concave portions an the second layer are formed by forming the second insulating material on a copper foil on which the convex portions are formed, and removing the copper foil to transfer the convex portions onto the surface of the second layer.

22. The sheet material according to claim 20, wherein a ten-point height of irregularities of the surface of the second layer, on which the concave potions are formed, is 0.1 to 10 μm.

23. The sheet material according to claim 22, wherein the ten-point height of irregularities of the surface of the second layer, on which the concave potions are formed, is 1 to 5 μm.

* * * * *